(12) United States Patent
Wang et al.

(10) Patent No.: US 12,238,860 B2
(45) Date of Patent: Feb. 25, 2025

(54) PRINTED CIRCUIT BOARD, DISPLAY DEVICE COMPRISING THE PRINTED CIRCUIT BOARD, AND IMAGE DISPLAY SYSTEM

(71) Applicants: BEIJING BOE DISPLAY TECHNOLOGY CO., LTD., Beijing (CN); BOE TECHNOLOGY GROUP CO., LTD., Beijing (CN)

(72) Inventors: Chunhua Wang, Beijing (CN); Rui Han, Beijing (CN); Yue Zhai, Beijing (CN); Jie Yu, Beijing (CN); Xiaoqiao Dong, Beijing (CN); Xiaoxia Wang, Beijing (CN); Pengtao Li, Beijing (CN); Tiantian Liu, Beijing (CN); Qiannan Pan, Beijing (CN); Biqi Li, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/275,209

(22) PCT Filed: Jul. 27, 2022

(86) PCT No.: PCT/CN2022/108242
§ 371 (c)(1),
(2) Date: Jul. 31, 2023

(87) PCT Pub. No.: WO2024/020855
PCT Pub. Date: Feb. 1, 2024

(65) Prior Publication Data
US 2025/0008642 A1  Jan. 2, 2025

(51) Int. Cl.
*G02F 1/1345* (2006.01)
*G02F 1/1347* (2006.01)
*H05K 1/02* (2006.01)

(52) U.S. Cl.
CPC ....... *H05K 1/0296* (2013.01); *G02F 1/13452* (2013.01); *G02F 1/1347* (2013.01);
(Continued)

(58) Field of Classification Search
CPC ....... H05K 1/0296; H05K 2201/09018; H05K 2201/10128; G02F 1/13452; G02F 1/1347
See application file for complete search history.

(56) References Cited

U.S. PATENT DOCUMENTS

2006/0077191 A1* 4/2006 Ming-Daw ....... G02F 1/133351
                                                                 345/204
2007/0216299 A1   9/2007 Park et al.
(Continued)

FOREIGN PATENT DOCUMENTS

CN        101043770 A      9/2007
CN        101101398 A      1/2008
(Continued)

OTHER PUBLICATIONS

CN 109658898 A machine translation (Year: 2019).*

*Primary Examiner* — James A Dudek
(74) *Attorney, Agent, or Firm* — Myers Bigel, P.A.

(57) ABSTRACT

A printed circuit board, a display device and an image display system are provided. The printed circuit board is configured to drive a display panel and includes a polygonal outline including a first side and a second side, and the extension direction of the first side and the extension direction of the second side intersect and are not perpendicular to each other. The printed circuit board includes a first interface configured to be electrically connected to a controller; and a
(Continued)

second interface configured to be electrically connected to the display panel. The length extension direction of the first interface forms a first included angle with respect to the extension direction of the first side, and the length extension direction of the second interface forms a second included angle with respect to the extension direction of the second side, each included angle is not greater than 20 degrees.

20 Claims, 5 Drawing Sheets

(52) U.S. Cl.
CPC .............. *H05K 2201/09018* (2013.01); *H05K 2201/10128* (2013.01)

(56) References Cited

U.S. PATENT DOCUMENTS

| | | |
|---|---|---|
| 2016/0240135 A1 | 8/2016 | Kim et al. |
| 2016/0240157 A1 | 8/2016 | Aoki et al. |
| 2017/0351019 A1* | 12/2017 | Kadowaki ............ G02F 1/13452 |
| 2018/0122303 A1* | 5/2018 | Tsai .................... G02F 1/13454 |
| 2018/0166467 A1 | 6/2018 | Lai et al. |
| 2021/0104184 A1 | 4/2021 | You et al. |
| 2021/0349500 A1 | 11/2021 | Qin et al. |
| 2022/0254857 A1* | 8/2022 | Xu ........................ G02F 1/1345 |
| 2023/0247871 A1 | 8/2023 | Zhou et al. |

FOREIGN PATENT DOCUMENTS

| | | |
|---|---|---|
| CN | 105895025 A | 8/2016 |
| CN | 106847174 A | 6/2017 |
| CN | 107561799 A | 1/2018 |
| CN | 107644592 A | 1/2018 |
| CN | 107703688 A | 2/2018 |
| CN | 108389516 A | 8/2018 |
| CN | 109658898 A | 4/2019 |
| CN | 109712558 A | 5/2019 |
| CN | 111599847 A | 8/2020 |
| EP | 3992705 A1 | 5/2022 |
| JP | 2002-221704 A | 8/2002 |
| WO | 2021/237725 A1 | 12/2021 |

* cited by examiner

PRINTED CIRCUIT BOARD, DISPLAY DEVICE COMPRISING THE PRINTED CIRCUIT BOARD, AND IMAGE DISPLAY SYSTEM

RELATED APPLICATIONS

The present application is a 35 U.S.C. 371 national stage application of PCT International Application No. PCT/CN2022/108242, filed on Jul. 27, 2022, the entire disclosure of which is incorporated herein by reference.

TECHNICAL FIELD

The present disclosure relates to the field of electronic technology, and in particular, to a printed circuit board (PCB), a display device comprising the printed circuit board, and an image display system.

BACKGROUND

Owing to the rapid development of semiconductor technology and electronic technology, display panels have been widely used in industrial production and people's daily life. For the convenience of manufacture, the appearance of a display panel is usually designed to have a rectangular shape. With the increasing diversity of the application scenarios of the display panel, people also began to pursue a personalized design of the display panel, and the outline of the display panel was designed into an irregular shape. For example, it is often desired to design a display panel applied to a display instrument in the interior space of an automobile or other vehicles to have an irregular shape, so as to improve the decorative effect of the interior space. However, even in these application scenarios, printed circuit boards for driving display panels are still designed into a rectangular shape. In practice, the printed circuit board is usually arranged below the display panel and acts to some extent as a kind of intermediate component. On the one hand, a printed circuit board often needs to receive relevant control signals and power supply signals from an external controller (such as a vehicle control system). On the other hand, there is a signal interaction between the printed circuit board and the display panel. The printed circuit board transmits relevant signals from the external controller to the display panel, meanwhile, the printed circuit board may also transmit feedback signals of the display panel or input signals received by the display panel to the external controller. As a result, a desired image displaying or an interaction between a user and a device applying the display panel is achieved under the control of the external controller.

SUMMARY

An embodiment of the present disclosure provides a printed circuit board for driving a display panel, the printed circuit board comprising a polygonal outline, the polygonal outline comprising a first side and a second side, an extension direction of the first side intersecting and being not perpendicular to an extension direction of the second side, the printed circuit board comprises: a first interface configured to be electrically connected to a controller to realize a first signal interaction between the printed circuit board and the controller; and a second interface configured to be electrically connected to the display panel to realize a second signal interaction between the printed circuit board and the display panel, so that the display panel performs image display under a control of the controller and the printed circuit board, a length extension direction of the first interface forms a first included angle with respect to the extension direction of the first side, a length extension direction of the second interface forms a second included angle with respect to the extension direction of the second side, and the first included angle and the second included angle are each not greater than 20 degrees.

In some embodiments, the printed circuit board further comprises: a third interface configured to be electrically connected to the controller to realize a third signal interaction between the printed circuit board and the controller; and a fourth interface configured to be electrically connected to the display panel to realize a fourth signal interaction between the printed circuit board and the display panel, so that the display panel performs image display under the control of the controller and the printed circuit board, a length extension direction of the third interface is consistent with the length extension direction of the first interface, and a length extension direction of the fourth interface is consistent with the length extension direction of the second interface.

In some embodiments, the first side of the polygonal outline is adjacent to the second side of the polygonal outline.

In some embodiments, the extension direction of the first side intersects the extension direction of the second side to form a third included angle, and the third included angle is between 70 and 80 degrees.

In some embodiments, the first interface and the second interface are electrically connected to each other, the third interface and the fourth interface are electrically connected to each other, and the polygonal outline comprises a third side opposite to the first side, the first interface and the second interface are closer to the first side than the third interface and the fourth interface, and the third interface and the fourth interface are closer to the third side than the first interface and the second interface.

In some embodiments, an extension direction of the third side intersects the extension direction of the second side to form a fifth included angle, and the fifth included angle is smaller than the third included angle.

In some embodiments, the first side of the polygonal outline and the second side of the polygonal outline are opposite to each other.

In some embodiments, the extension direction of the first side intersects the extension direction of the second side to form a fourth included angle, and the fourth included angle is between 20 and 30 degrees.

In some embodiments, each of the length extension direction of the first interface, the length extension direction of the second interface, the length extension direction of the third interface, and the length extension direction of the fourth interface is parallel to the extension direction of the second side.

In some embodiments, the first interface and the second interface are electrically connected to each other, and the third interface and the fourth interface are electrically connected to each other, the polygonal outline of the printed circuit board further comprises: a third side, the extension direction of the first side and the extension direction of the second side each intersecting an extension direction of the third side, a fourth side opposite to the third side, the extension direction of the second side and the extension direction of the first side each intersecting an extension direction of the fourth side, the first interface and the second interface are closer to the third side than the third interface and the fourth interface, and the third interface and the fourth interface are closer to the fourth side than the first interface and the second interface.

In some embodiments, the printed circuit board further comprises: a fifth interface configured to be electrically connected to the controller to realize a fifth signal interaction between the printed circuit board and the controller; a sixth interface configured to be electrically connected to a backlight module to realize a sixth signal interaction between the printed circuit board and the backlight module, so that the display panel performs image display under the control of the controller, the printed circuit board and the backlight module, the fifth interface is closer to the first side than the sixth interface, and the sixth interface is closer to the second side than the fifth interface.

In some embodiments, a length extension direction of the fifth interface is consistent with the length extension direction of the first interface, the length extension direction of the fifth interface forms an included angle of 70 to 80 degrees with respect to the extension direction of the second side, and a length extension direction of the sixth interface forms an included angle of 60 to 70 degrees with respect to the extension direction of the second side.

In some embodiments, a length extension direction of the fifth interface forms an included angle of 10 to 20 degrees with respect to the extension direction of the second side, and a length extension direction of the sixth interface forms an included angle of 60 to 70 degrees with respect to the extension direction of the second side.

In some embodiments, the first included angle and the second included angle are each 0 degree, so that the length extension direction of the first interface is parallel to the extension direction of the first side of the polygonal outline, and the length extension direction of the second interface is parallel to the extension direction of the second side of the polygonal outline.

In some embodiments, the polygonal outline comprises a hexagon, and the first side and the second side are two adjacent sides or two opposite sides of the hexagon.

In some embodiments, the first interface, the second interface, the third interface and the fourth interface are located on a first surface of a printed circuit board body of the printed circuit board, the printed circuit board further comprises an electrical component on the first surface of the printed circuit board body, the electrical component comprises at least one selected from a group consisting of an integrated circuit chip, a resistor and a capacitor, and a height of each of the first interface, the second interface, the third interface and the fourth interface on the first surface of the printed circuit board body is 2 to 15 times a height of the electrical component on the first surface of the printed circuit board body.

In some embodiments, the first surface of the printed circuit board body comprises a component-free region between the electrical component and any one of the first interface, the second interface, the third interface and the fourth interface, the component-free region has a diameter of greater than or equal to 1.5 mm.

Another embodiment of the disclosure provides a display device comprising: the printed circuit board according to any one of the foregoing embodiments, a first flexible electrical connector and a display panel. A first end of the first flexible electrical connector is connected to the second interface of the printed circuit board, and a second end of the first flexible electrical connector is connected to the display panel.

According to another embodiments of the disclosure, the display device comprises the printed circuit board according to any one of the foregoing embodiments; a first flexible electrical connector; a second flexible electrical connector, and a display panel. The display panel comprises a first liquid crystal display panel and a second liquid crystal display panel arranged successively along a light exit direction of the display device, a first end of the first flexible electrical connector is connected to the second interface of the printed circuit board, and a second end of the first flexible electrical connector is connected to the first liquid crystal display panel; a first end of the second flexible electrical connector is connected to the fourth interface of the printed circuit board, and a second end of the second flexible electrical connector is connected to the second liquid crystal display panel.

In some embodiments, the first liquid crystal display panel comprises a first source driver, and the second liquid crystal display panel comprises a second source driver, wherein the second end of the first flexible electrical connector is connected to the first source driver, and the second end of the second flexible electrical connector is connected to the second source driver, the length extension direction of the second interface is parallel to a length extension direction of the first source driver, and the length extension direction of the fourth interface is parallel to a length extension direction of the second source driver.

In some embodiments, the display device comprises a backlight module for providing backlight for the display panel, and the printed circuit board is located on a side of the backlight module facing away from the display panel.

In some embodiments, the printed circuit board further comprises: a fifth interface configured to be electrically connected to the controller to realize a fifth signal interaction between the printed circuit board and the controller; a sixth interface configured to be electrically connected to the backlight module to realize a sixth signal interaction between the printed circuit board and the backlight module, so that the display panel performs image display under the control of the controller, the printed circuit board, and the backlight module.

Yet another embodiment of the present disclosure provides an image display system comprising: a controller; and the display device according to any one of the foregoing embodiments, the controller is at least electrically connected to the first interface of the printed circuit board, so that the display panel performs image display under the control of the controller and the printed circuit board.

Some embodiments of the present disclosure have been summarized above. Other different embodiments can be obtained based on a combination of some embodiments and a combination of features in different embodiments, and these different embodiments also fall within the protection scope of the present disclosure.

BRIEF DESCRIPTION OF THE DRAWINGS

Embodiments of the present disclosure will now be described in more detail with reference to the accompanying drawings. It can be understood that the sectional views or top views of a printed circuit board and an electronic device comprising the printed circuit board shown in the drawings only schematically represent partial structures or partial components of the printed circuit board or the electronic device related to the technical solutions described in the embodiments of the present disclosure, and do not represent the actual product structures.

FIG. 6 schematically illustrates an example in which the printed circuit board shown in FIG. 1 or FIG. 3 is applied to an auxiliary screen in a vehicle;

DETAILED DESCRIPTION

Specific details of the embodiments of the present disclosure will be described below to enable those skilled in the art to fully understand and practice the embodiments of the present disclosure. In some cases, the present disclosure does not illustrate or describe in detail some structures or functions that are well known in the art to avoid obscuring the description of the embodiments of the present disclosure with unnecessary description. The technical solution of this patent application can be embodied in many different forms and purposes, and should not be limited to the embodiments described herein. These embodiments are provided to make the technical solution of the present disclosure clear and complete, but the embodiments do not limit the protection scope of this patent application.

The "display device" mentioned herein refers to an electronic device with an image display function, and examples of a display device include but are not limited to a liquid crystal display, an organic light emitting diode display, and the like. The entirety of all components in the display device except for the auxiliary components (such as a frame, backlight module, etc.) that are not directly related to the image display function of the display device is referred to as a display panel herein. In other words, the display panel has a basic image display function and is the core component of the display device to realize the image display function. For example, a liquid crystal display panel at least comprises an array substrate, a color filter substrate, and a liquid crystal layer between the array substrate and the color filter substrate. An organic light emitting diode display panel at least comprises an array substrate and an organic light emitting diode element fabricated or mounted on the array substrate. The "included angles" mentioned herein, such as "first included angle", "second included angle" and the like, refer to non-obtuse angles formed by an intersection of two straight lines.

As mentioned above, with the increasing diversity of application scenarios of display panels, non-rectangular display panels have emerged, thereby highlighting the individuality of products to which the display panels are applied. However, the printed circuit board for driving the display panel still maintains a rectangular shape, and correspondingly, the various components on the printed circuit board body are also arranged in a regular manner, that is, arranged on the surface of the printed circuit board body in a "horizontal and vertical" manner. Inventors of this application have realized that, in an application scenario involving an irregularly shaped display panel, if a conventional rectangular printed circuit board is used, the stability or reliability of signal connections between the printed circuit board and the display panel, and between the printed circuit board and an external controller will be greatly challenged.

An embodiment of the present disclosure provides a printed circuit board for driving a display panel. The printed circuit board comprises a polygonal outline including a first side and a second side. An extension direction of the first side and an extension direction of the second side intersect and are not perpendicular to each other. The printed circuit board comprises: a first interface configured to be electrically connected to a controller to realize a first signal interaction between the printed circuit board and the controller; and a second interface configured to be electrically connected to the display panel to realize a second signal interaction between the printed circuit board and the display panel, so that the display panel performs image display under the control of the controller and the printed circuit board. A length extension direction of the first interface forms a first included angle with respect to the extension direction of the first side of the polygonal outline, a length extension direction of the second interface forms a second included angle with respect to the extension direction of the second side of the polygonal outline, and the first included angle and the second included angle are each not greater than 20 degrees.

The interfaces such as "first interface" and "second interface" mentioned herein refer to connection ports of the printed circuit board for realizing its electrical connections with external components (e.g., an electrical connector connected to the display panel or the controller). Examples of an interface include but are not limited to a printed circuit board connection terminal or a printed circuit board connector. The "length extension direction" related to an interface mentioned herein refers to an extension direction of a side with the longest length of the outline of an orthographic projection of the interface on the printed circuit board body. For example, in the case that the outline of the orthographic projection of the first interface on the printed circuit board body is a rectangle, the length extension direction of the first interface refers to an extension direction of a long side of the rectangular outline of the first interface. The "controller" mentioned herein refers to a device or system that provides required signals for the display panel to display images. The specific form of the "controller" may vary with the application scenario of the display panel. The controller may be a single integrated circuit chip and may also be a system including a plurality of integrated circuit chips and peripheral circuits between the plurality of integrated circuit chips. The display panel receives signals required to display images from the controller during operation, so the above-mentioned controller can be called a "host". For example, when the display panel is applied to an instrument display system in a vehicle, the controller may be an electronic control unit (ECU) of the vehicle.

In the embodiment of the present disclosure, the printed circuit board comprises a polygonal outline, and the extension direction of the first side and the extension direction of the second side of the polygonal outline intersect and are not perpendicular to each other, which means that the outline of the printed circuit board is a non-rectangular shape. In some embodiments, the outline of the printed circuit board may be identical or substantially consistent with the outline of the display panel, that is, the outline of the printed circuit board may be determined based on the outline of the display panel. The printed circuit board comprises a first interface and a second interface, which enables the printed circuit board to be electrically connected to the controller and the display panel, respectively, so that the display panel performs image display under the control of the controller and the printed circuit board. The length extension direction of the first interface forms a first included angle with respect to the extension direction of the first side of the polygonal outline of the printed circuit board, and the length extension direction of the second interface forms a second included angle with respect to the extension direction of the second side of the polygonal outline of the printed circuit board. Each of the first included angle and the second included angle is not greater than 20 degrees. That is to say, the length extension direction of the first interface is parallel to the extension direction of the first side of the polygonal outline of the printed circuit board or a deviation between them is not greater than 20 degrees, and the length extension direction of the second interface is parallel to the extension direction of the second side of the polygonal outline of the printed circuit board or a deviation between them is not greater than 20 degrees. Since the first interface and the second interface of the printed circuit board provided by this embodiment are not arranged "horizontally and vertically" like the interfaces of a conventional printed circuit board, the length extension directions of the first interface and the second interface keep consistent with the extension direction of the first side or the second side of the polygonal outline of the printed circuit board or have a small deviation, so that the spatial positioning of the display panel and the controller relative to the printed circuit board can be adjusted more flexibly, the spatial layout of connection devices between the printed circuit board and the display panel or the controller can be optimized, and the distortion or deformation of connection devices between the display panel and the printed circuit board and between the printed circuit board and the controller can be avoided or alleviated, which enhances the reliability and stability of electrical connections between the printed circuit board and the display panel or the controller, and helps to improve the image display effect of the display panel.

Figure 1:
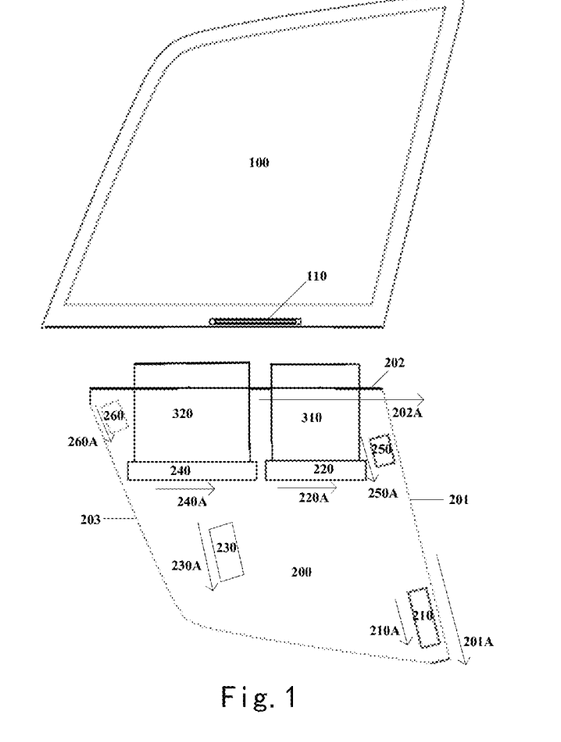
FIG. 1 schematically illustrates an outline of a printed circuit board according to an embodiment of the present disclosure and an outline of a display panel electrically connected to the printed circuit board.

The printed circuit board provided by the embodiment of the present disclosure will be further described below by specific examples. FIG. 1 schematically shows a display panel 100, a printed circuit board 200, and connection devices 310 and 320 between the display panel 100 and the printed circuit board 200. For clarity, the display panel 100 and the printed circuit board 200 are illustrated in an unconnected state in FIG. 1. As shown in FIG. 1, the printed circuit board 200 comprises a polygonal outline including a first side 201 and a second side 202. An extension direction 201A of the first side 201 and an extension direction 202A of the second side 202 intersect and are not perpendicular to each other. The printed circuit board comprises a first interface 210 and a second interface 220. The first interface 210 is electrically connected to a controller (not shown in FIG. 1) to realize a first signal interaction between the printed circuit board 200 and the controller, and the second interface 220 is electrically connected to the display panel 100 to realize a second signal interaction between the printed circuit board 200 and the display panel 100, so that the display panel 100 performs image display under the control of the controller and the printed circuit board 200. A length extension direction 210A of the first interface 210 forms a first included angle with respect to the extension direction 201A of the first side of the polygonal outline, and a length extension direction 220A of the second interface 220 forms a second included angle with respect to the extension direction 202A of the second side of the polygonal outline, and the first included angle and the second included angle are each not greater than 20 degrees. The connection devices for connecting the controller to the printed circuit board 200 may be connected to the first interface 210 in the vicinity of the first side 201 of the printed circuit board 200, and the connection devices (e.g., connection devices 310, 320 as shown) between the display panel 100 and the printed circuit board 200 may be connected to the second interface 220 in the vicinity of the second side 202 of the printed circuit board 200. Due to a small deviation between the length extension direction of the first interface 210 and the extension direction of the first side 201, and a small deviation between the length extension direction of the second interface 220 and the extension direction of the second side 202, the possibility of distortion or deformation of the connection devices between the display panel and the printed circuit board and between the printed circuit board and the controller is reduced, and the stresses at connections between the first interface 210 and corresponding connection device, and between the second interface 220 and corresponding connection device, are decreased, so that the stability of the connections between the first interface and corresponding connection device, and between the second interface and corresponding connection device is enhanced. For example, the connection device 310 between the display panel 100 and the printed circuit board 200 shown in FIG. 1 may be a flexible connector such as a flexible printed circuit board (FPC). In the case that the display panel 100 is connected to the second interface 220 of the printed circuit board via the flexible connector 310, the flexible connector 310 will not distort or distort to a low degree, which facilitates a good electrical connection between the printed circuit board 200 and the display panel.

In some embodiments, the first included angle between the length extension direction of the first interface and the extension direction of the first side of the polygonal outline of the printed circuit board is not greater than 10 degrees, and the second included angle between the length extension direction of the second interface and the extension direction of the second side of the polygonal outline of the printed circuit board is not greater than 10 degrees. In other embodiments, the first included angle between the length extension direction of the first interface and the extension direction of the first side of the polygonal outline of the printed circuit board, and the second included angle between the length extension direction of the second interface and the extension direction of the second side of the polygonal outline of the printed circuit board are both 0 degree, that is, the length extension direction of the first interface is parallel to the extension direction of the first side of the polygonal outline of the printed circuit board, and the length extension direction of the second interface is parallel to the extension direction of the second side of the polygonal outline of the printed circuit board. As a result, the reliability of connections between the first interface of the printed circuit board and corresponding connection device, and between the second interface of the printed circuit board and corresponding connection device can be further ensured, and the stability of signal transmissions between the printed circuit board, and the controller and the display panel can be enhanced.

According to another embodiment of the present disclosure, the printed circuit board further comprises: a third interface configured to be electrically connected to the controller to realize a third signal interaction between the printed circuit board and the controller; and a fourth interface configured to be electrically connected to the display panel to realize a fourth signal interaction between the printed circuit board and the display panel, so that the display panel performs image display under the control of the controller and the printed circuit board. The length extension direction of the third interface is consistent with the length extension direction of the first interface, and the length extension direction of the fourth interface is consistent with the length extension direction of the second interface. This embodiment is applicable to a situation where there are many signal paths between the display panel and the printed circuit board or the display panel includes at least two modules that receive signals from the printed circuit board independently. For example, the display panel may be a BD cell (double-stacked) display panel, that is, the display panel includes a double-layer liquid crystal display panel, where one layer of liquid crystal display panel is a black and white liquid crystal display panel for precisely modulating brightness, and the other layer of liquid crystal display panel is a color liquid crystal display panel for image display. The two layers of liquid crystal display panels are superimposed to realize high-contrast image display.

The printed circuit board provided by this embodiment can be illustrated by continuing to refer to FIG. 1. As shown in FIG. 1, the printed circuit board further comprises a third interface 230 and a fourth interface 240. The third interface 230 is configured to be electrically connected to the controller to realize a third signal interaction between the printed circuit board 200 and the controller, and the fourth interface 240 is configured to be electrically connected to the display panel 100 to realize a fourth signal interaction between the printed circuit board 200 and the display panel 100, so that the display panel 100 performs image display under the control of the controller and the printed circuit board 200. The length extension direction 230A of the third interface 230 is consistent with the length extension direction 210A of the first interface 210, and the length extension direction 240A of the fourth interface 240 is consistent with the length extension direction 220A of the second interface 220. That is, the third interface 230 is arranged on the printed circuit board body in a manner similar to that of the first interface 210 (that is, the extension direction of the third interface 230 and the extension direction of the first side 201 have a small deviation or are parallel to each other), and the fourth interface 240 is arranged on the printed circuit board body in a manner similar to that of the second interface 220 (that is, the extension direction of the fourth interface 240 and the extension direction of the second side 202 have a small deviation or are parallel to each other). In the case that the display panel 100 is connected to the fourth interface 240 of the printed circuit board via the flexible connector 320, the flexible connector 320 will not distort or distort to a low degree, so that a good electrical connection between the printed circuit board 200 and the display panel can be realized.

Figure 2:
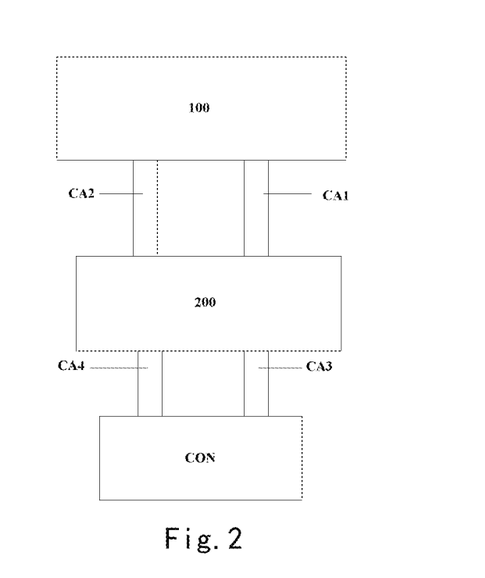
FIG. 2 schematically illustrates connection relationships between a printed circuit board and a display panel, and between a printed circuit board and a controller according to an embodiment of the present disclosure.

FIG. 2 schematically illustrates connection devices CA1 and CA2 between a BD cell display panel 100 and the printed circuit board 200, and connection devices CA3 and CA4 between the printed circuit board 200 and a controller CON. The display panel 100, the printed circuit board 200, and the controller CON shown in FIG. 2 are rectangular, but this does not represent their outline shapes. FIG. 2 only illustrates these components in blocks for simplicity. In particular, the actual outlines of the printed circuit board 200 and the display panel 100 may present any non-rectangular shape. The first interface and the third interface of the printed circuit board 200 are connected to the connection devices CA3 and CA4 respectively, and the second interface and the fourth interface of the printed circuit board 200 are connected to the connection devices CA1 and CA2 respectively. The connection devices CA1 and CA2 correspond to the connection devices 310 and 320 in FIG. 1 respectively. With the printed circuit board 200 provided by the embodiment of the present disclosure, it is possible to alleviate or avoid the spatial distortion or deformation of the connection devices CA1, CA2, CA3 and CA4, and decrease the stresses at connections between the interfaces of the printed circuit board and corresponding connection devices, so that the stability of the connections between the interfaces and the corresponding connection devices can be enhanced, the stability of signal transmissions between the printed circuit board 200 and the controller CON and between the printed circuit board 200 and the display panel 100 can be increased, and the operating performance and the image display effect of the display panel can be improved.

In some embodiments, the controller CON may transmit power supply signals as well as image data signals and control signals required by the display panel 100 for image display to the printed circuit board 200 via the connection devices CA3 and CA4, and the printed circuit board 200 transmits the power supply signals, the image data signals and the control signals to the display panel. The display panel 100 may also transmit a feedback signal from the display panel and an external input signal received by the display panel to the controller CON via the printed circuit board 200. Therefore, the first signal interaction, the second signal interaction, the third signal interaction and the fourth signal interaction mentioned above refer to signal transmissions between the display panel and the printed circuit board, or between the printed circuit board and the controller during the operation of the display panel. The technical solution of the present disclosure does not involve how the display panel displays images, and details of the first signal interaction, the second signal interaction, the third signal interaction, and the fourth signal interaction will not be described here.

Figure 3:
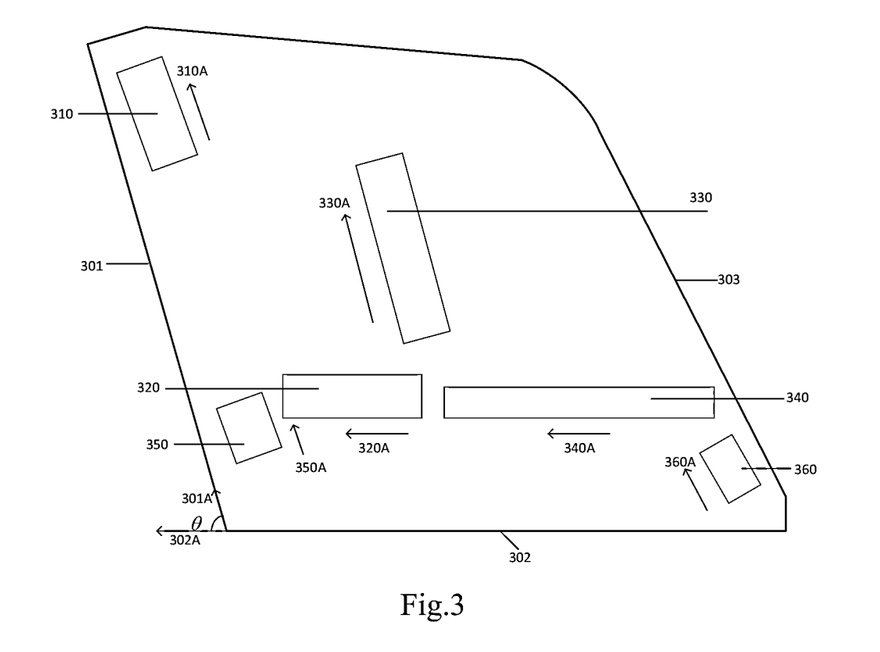
FIG. 3 schematically illustrates a physical picture of a printed circuit board according to another embodiment of the present disclosure.

FIG. 3 schematically illustrates a physical picture of a printed circuit board according to an embodiment of the present disclosure. As shown in FIG. 3, the printed circuit board comprises a polygonal outline including a first side 301 and a second side 302. An extension direction of the first side 301 and an extension direction of the second side 302 intersect but are not perpendicular to each other. In this embodiment, the first side 301 and the second side 302 are adjacent to each other. The printed circuit board comprises a first interface 310, a second interface 320, a third interface 330, and a fourth interface 340, which may functionally correspond to the first interface 210, the second interface 220, the third interface 230 and the fourth interface 240 shown in FIG. 1, respectively. According to the embodiment of the present disclosure, the extension direction of the first side 301 and the extension direction of the second side 302 intersect to form a third included angle θ, and the third included angle θ is between 70 and 80 degrees. In an example, the third included angle θ is 76 degrees.

Figure 4A:
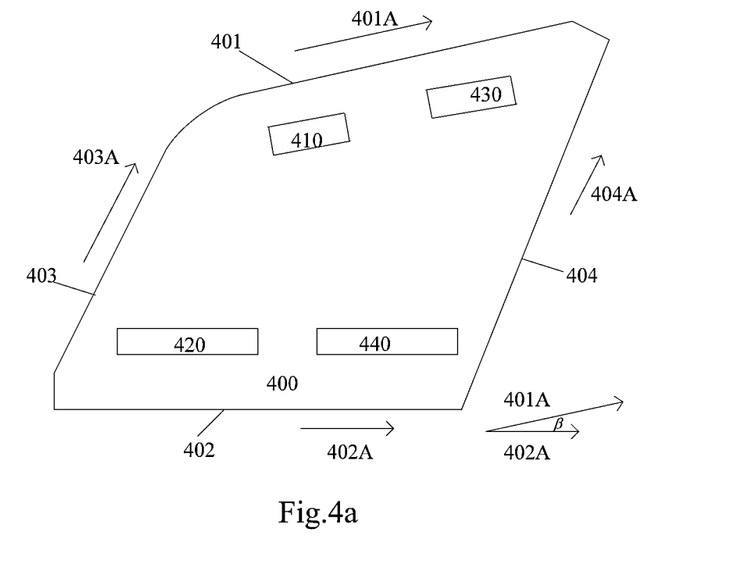
FIG. 4a schematically illustrates an outline of a printed circuit board according to a further embodiment of the present disclosure and some interfaces of the printed circuit board.

FIG. 4a illustrates an outline of a printed circuit board according to another embodiment of the present disclosure and some interfaces on the printed circuit board. As shown in FIG. 4a, a printed circuit board 400 comprises a first interface 410, a second interface 420, a third interface 430, and a fourth interface 440, which may functionally correspond to the first interface 210, the second interface 220, the third interface 230, and the fourth interface 240 shown in FIG. 1, respectively. The printed circuit board comprises a first side 401 and a second side 402, and an extension direction of the first side 401 and an extension direction of the second side 402 intersect and are not perpendicular to each other. In this embodiment, the first side 401 of the polygonal outline of the printed circuit board and the second side 402 of the polygonal outline are opposite to each other. The term "opposite to each other" mentioned here refers to a non-adjacent positional relationship between the first side and the second side. As shown in FIG. 4a, according to some embodiments of the present disclosure, the extension direction 401A of the first side 401 and the extension direction 402A of the second side 402 of the polygonal outline of the printed circuit board intersect to form a fourth included angle β. The fourth included angle β is between 20 and 30 degrees. In this embodiment, the included angle between the length extension direction of the first interface 410 or the third interface 430, and the extension direction of the first side 401 of the polygonal outline of the printed circuit board is less than 10 degrees, that is, the length extension direction of the first interface 410 or the third interface 430 and the extension direction of the first side 401 of the polygonal outline of the printed circuit board have a small deviation or are parallel to each other. The connection devices between the printed circuit board and the controller are connected to the first interface 410 or the third interface 430 in the vicinity of the first side 401. In the case that the printed circuit board 400 is connected to the controller via the connection devices, the connection devices between the printed circuit board 400 and the controller will not distort or distort to a low degree, so that the reliability and stability of the connection between the printed circuit board 400 and the controller can be enhanced. Similarly, the length extension direction of the second interface 420 and the fourth interface 440 and the extension direction of the second side 402 of the polygonal outline of the printed circuit board have a small deviation or are parallel to each other, which helps to enhance the stability and reliability of the connection of the printed circuit board 400 to the display panel via the second interface 420 and the fourth interface 440 as well as corresponding connection devices.

As described above, in some embodiments, the first included angle between the length extension direction of the first interface and the extension direction of the first side of the polygonal outline of the printed circuit board and the second included angle between the length extension direction of the second interface and the extension direction of the second side of the polygonal outline of the printed circuit board are each 0 degree, so that the length extension direction of the first interface is parallel to the extension direction of the first side of the polygonal outline, and the length extension direction of the second interface is parallel to the extension direction of the second side of the polygonal outline. As a result, the reliability of connections between the first interface of the printed circuit board and corresponding connection device, and between the second interface of the printed circuit board and corresponding connection device can be further ensured, and the stability of signal transmissions between the printed circuit board, and the controller and the display panel can be enhanced. Similarly, the length extension direction of the third interface may be consistent with the length extension direction of the first interface, and the length extension direction of the fourth interface may be consistent with the length extension direction of the second interface, that is, the length extension direction of the third interface is parallel to the extension direction of the first side of the polygonal outline, and the length extension direction of the fourth interface is parallel to the extension direction of the second side of the polygonal outline.

Referring back to FIG. 1, according to some embodiments of the present disclosure, the first interface 210 and the second interface 220 of the printed circuit board are electrically connected to each other, and the third interface 230 and the fourth interface 240 of the printed circuit board are electrically connected to each other. The polygonal outline of the printed circuit board includes a third side 203 opposite to the first side 201. The first interface 210 and the second interface 220 are closer to the first side 201 than the third interface 230 and the fourth interface 240, and the third interface 230 and the fourth interface 240 are closer to the third side 203 than the first interface 210 and the second interface 220. The first interface 210 and the third interface 230 of the printed circuit board can receive power supply signals as well as image data signals and control signals required by the display panel for image display from the controller via the connection devices respectively. The first interface 210 and the third interface 230 transmit the received signals to the second interface 220 and the fourth interface 240 respectively. In some embodiments, a further signal processing circuit, for example, a voltage conversion circuit, is disposed in the electrical connection path between the first interface 210 and the second interface 220. The voltage conversion circuit performs step-up or step-down processing on a power supply voltage received by the first interface 210 to obtain a voltage suitable for the operation of integrated circuit chips or active elements of the display panel. Further, the electrical connection path between the first interface 210 and the second interface 220 may be further provided with peripheral circuits required for the operation of the integrated circuit chips of the display panel. Similarly, the electrical connection path between the third interface 230 and the fourth interface 240 may also be provided with a voltage conversion circuit and peripheral circuits required for the operation of the integrated circuit chips of the display panel. The first interface 210 and the second interface 220 are closer to the first side 201 than the third interface 230 and the fourth interface 240, and the third interface 230 and the fourth interface 240 are closer to the third side 203 opposite to the first side 201 than the first interface 210 and the second interface 220, which helps to reduce a signal interference between the signal path between the first interface 210 and the second interface 220 and the signal path between the third interface 230 and the fourth interface 240. In particular, if the display panel 100 is a BD cell display panel, the second interface 220 and the fourth interface 240 may be electrically connected to the black and white liquid crystal display panel and the color liquid crystal display panel respectively. The arrangement of the first interface, the second interface, the third interface and the fourth interface provided by this embodiment can effectively reduce a mutual interference between signals received by the black and white liquid crystal display panel and the color liquid crystal display panel, and improve the image display quality of the display panel. The embodiment shown in FIG. 3 illustrates a similar technical solution. As shown in FIG. 3, the first interface 310 and the second interface 320 of the printed circuit board are electrically connected to each other, and the third interface 330 and the fourth interface 340 of the printed circuit board are electrically connected to each other. The polygonal outline of the printed circuit board includes a third side 303 opposite to the first side 301. The first interface 310 and the second interface 320 are closer to the first side 301 than the third interface 330 and the fourth interface 340, and the third interface 330 and the fourth interface 340 are closer to the third side 303 than the first interface 310 and the second interface 320.

The third side 203 and the second side 202 of the polygonal outline of the printed circuit board may be adjacent, or there are other sides of the polygonal outline between the third side 203 and the second side 202 of the polygonal outline of the printed circuit board. In some embodiments, the extension direction of the third side and the extension direction of the second side intersect each other and form a fifth included angle that is smaller than the third included angle formed by the first side and the second side. For example, the fifth included angle is between 60 and 70 degrees. For example, the included angle formed by the intersection of the extension direction of the third side 303 and the extension direction of the second side 302 of the polygonal outline of the printed circuit board shown in FIG. 3 is smaller than the included angle formed by the first side 301 and the second side 302.

Continuing to refer to FIG. 4a, in some embodiments, the polygonal outline of the printed circuit board includes a third side 403 and a fourth side 404. The extension direction 401A of the first side 401 and the extension direction 402A of the second side 402 each intersect the extension direction 403A of the third side 403, the fourth side 404 and the third side 403 are opposite to each other, and the extension direction 401A of the first side 401 and the extension direction 402A of the second side 402 each intersect the extension direction 404A of the fourth side 404. The first interface 410 and the second interface 420 are closer to the third side 403 than the third interface 430 and the fourth interface 440, and the third interface 430 and the fourth interface 440 are closer to the fourth side 404 than the first interface 410 and the second interface 420. Similarly, this embodiment can reduce a signal interference between the signal path between the first interface 410 and the second interface 420 and the signal path between the third interface 430 and the fourth interface 440, which helps to improve the image display quality of the display panel. In the embodiment of FIG. 4a, the extension direction of the third side 403 of the polygonal outline of the printed circuit board intersects the extension direction of the second side 402 to form a sixth included angle, and the extension direction of the fourth side 404 intersects the extension direction of the second side 402 to form a seventh included angle. The sixth included angle and the seventh included angle are between 60 and 80 degrees.

Figure 4B:
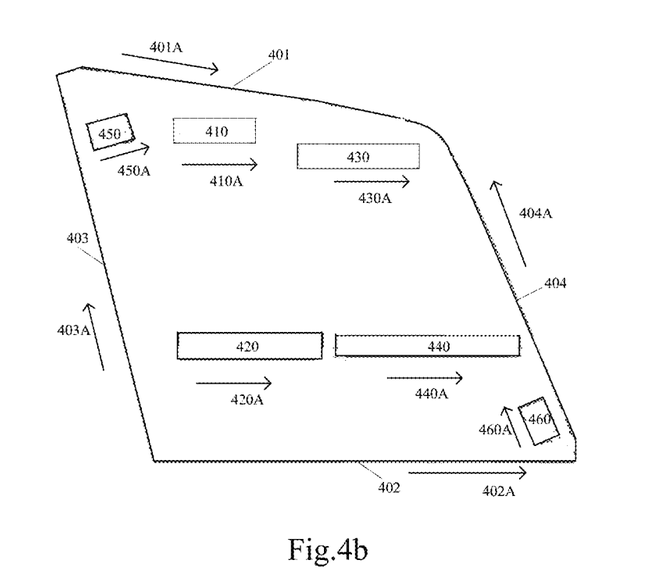
FIG. 4b schematically illustrates an outline of a printed circuit board according to yet another embodiment of the present disclosure and some interfaces of the printed circuit board.

FIG. 4b illustrates an outline of a printed circuit board according to another embodiment of the present disclosure and some interfaces on the printed circuit board. As shown in FIG. 4b, the polygonal outline of the printed circuit board includes a first side 401, a second side 402 opposite to the first side, a third side 403, and a fourth side 404 opposite to the third side. The printed circuit board comprises a first interface 410, a second interface 420, a third interface 430 and a fourth interface 440. Each of the length extension direction 410A of the first interface 410, the length extension direction 420A of the second interface 420, the length extension direction 430A of the third interface 430, and the length extension direction 440A of the fourth interface 440 is parallel to the extension direction of the second side 402.

According to some embodiments of the present disclosure, in addition to the first interface, the second interface, the third interface and the fourth interface described above, the printed circuit board may further comprise a further interface. For example, as shown in FIG. 1, the printed circuit board further comprises a fifth interface 250 configured to be electrically connected to the controller to realize a fifth signal interaction between the printed circuit board 200 and the controller; and a sixth interface 260 configured to be electrically connected to the fifth interface 250 and the display panel 100 to realize a sixth signal interaction between the printed circuit board 200 and the display panel, so that the display panel 100 performs image display under the control of the controller and the printed circuit board 200. The fifth interface 250 is closer to the first side 201 than the sixth interface 260, and the sixth interface 260 is closer to the second side 202 than the fifth interface 250. The picture of the printed circuit board shown in FIG. 3 also shows a fifth interface 350 and a sixth interface 360. In some embodiments, the display panel requires backlight for normal image display. In this case, a backlight module is required to provide backlight for the display panel. The sixth interface of the printed circuit board may be electrically connected to the backlight module to provide the backlight module with a backlight module signal for driving the backlight module, and the fifth interface is electrically connected to the controller to receive the backlight module signal from the controller. In the embodiment shown in FIG. 3, the length extension direction 350A of the fifth interface 350 is consistent with the length extension direction 310A of the first interface 310. The length extension direction 350A of the fifth interface 350 forms an included angle of 70 to 80 degrees with respect to the extension direction of the second side 302, and the length extension direction 360A of the sixth interface 360 forms an included angle of 60 to 70 degrees with respect to the extension direction of the second side 302. In the embodiment shown in FIG. 4b, the printed circuit board comprises a fifth interface 450 and a sixth interface 460. The length extension direction 450A of the fifth interface 450 forms an included angle of 10-20 degrees with respect to the extension direction 402A of the second side 402, and the length extension direction 460A of the sixth interface 460 forms an included angle of 60 to 70 degrees with respect to the extension direction of the second side 402.

In some embodiments of the present disclosure, as shown in FIG. 1, FIG. 3, FIG. 4a or 4b, the polygonal outline of the printed circuit board includes a hexagon, and the first side and the second side are two adjacent sides or two opposite sides of the hexagon. The hexagonal shape of the polygonal outline of the printed circuit board does not mean that the polygonal outline necessarily includes six straight line segments enclosing a hexagonal shape, but may mean that the polygonal outline approximates to a hexagonal shape. For example, some sides of a hexagonal outline may not be straight line segments, but have arbitrary curved portions. The intersection of adjacent sides of the hexagonal outline may also exhibit any chamfer. It can be appreciated that the specific shape of the polygonal outline of the printed circuit board is not limited to the embodiments described herein. In some cases, the shape of the polygonal outline of the printed circuit board may conform to or approximate to the shape of the outline of the display panel. Therefore, the polygonal outline of the printed circuit board shown in the drawings of the present disclosure only schematically represents a non-rectangular shape, and does not limit the specific shape of the outline of the printed circuit board.

According to some embodiments of the present disclosure, the first interface, the second interface, the third interface, and the fourth interface are located on a first surface of the printed circuit board body. The printed circuit board further comprises an electrical component on the first surface of the printed circuit board body. The electrical component includes at least one of an integrated circuit chip (for example, a memory, the voltage conversion circuit described above, etc.), a resistor and a capacitor. The height of each of the first interface, the second interface, the third interface and the fourth interface on the first surface of the printed circuit board body is 2 to 15 times the height of the electrical component on the first surface of the printed circuit board body. The printed circuit board body mentioned here refers to a structure for carrying the above-mentioned interfaces and electrical components of the printed circuit board. In other words, the printed circuit board body may correspond to a state of the printed circuit board when the above-mentioned interfaces and electrical components have not been mounted on the printed circuit board. The height mentioned here refers to a distance that any component (for example, the first interface) on the printed circuit board protrudes from the first surface of the printed circuit board body in a direction away from the printed circuit board body. In some examples, the heights of the first interface, the second interface, the third interface, and the fourth interface on the first surface of the printed circuit board body are about 2.5 mm, while the heights of other electrical components are 0.2 to 1.2 mm.

According to some embodiments of the present disclosure, the first surface of the printed circuit board body comprises a component-free region between the electrical component and any one of the first interface, the second interface, the third interface and the fourth interface, the component-free region has a diameter of greater than or equal to 1.5 mm. The component-free region herein refers to a region where no components are mounted. That is to say, there is a component-free region with a size of at least 1.5 mm between each interface of the printed circuit board and the electrical component, which can reduce a mutual influence between each interface and other electrical components.

Figure 5:
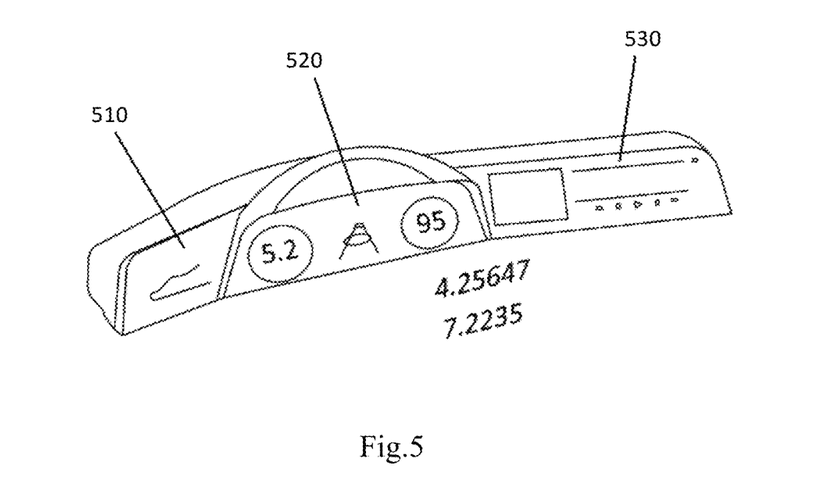
FIG. 5 schematically illustrates an example of an application scenario to which the printed circuit boards according to the embodiments of the present disclosure can be applied.

The application scenarios of the printed circuit board described in the above embodiments may be determined by the application scenarios of the display panel. The display panel can be applied to any occasion that requires image display, for example, it can be used in image display platforms in various vehicles. FIG. 5 illustrates an image display platform in a vehicle, which includes an auxiliary screen 510, an instrument display screen 520 and a central control display screen 530. It can be seen from FIG. 5 that at least some display screens (for example, the auxiliary screen 510 or the central control display screen 530) present a non-rectangular shape. Accordingly, it is possible to design a corresponding printed circuit board, especially a layout of the interfaces of the printed circuit board on the printed circuit board body using the principles revealed by the printed circuit board proposed by the embodiments of the present disclosure, so as to enhance the reliability and stability of the connection between the display screen and the control system of the vehicle, thereby improving the image display quality of the display screen.

Figure 6:
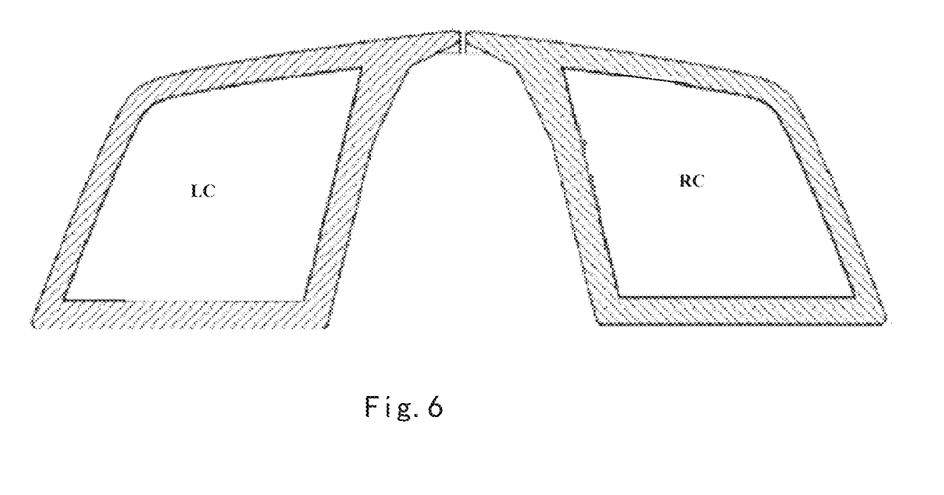

FIG. 6 schematically illustrates an example in which the printed circuit board shown in FIG. 3 or FIG. 4a is applied to an auxiliary screen in a vehicle. As shown in FIG. 6, the image display platform of the vehicle includes a left auxiliary screen LC and a right auxiliary screen RC. The left auxiliary screen LC and the right auxiliary screen RC shown in FIG. 6 may exist in the same vehicle. Alternatively, the vehicle may include only one of the left auxiliary screen LC and the right auxiliary screen RC. The left auxiliary screen and the right auxiliary screen may include a BD cell display panel, respectively. For the left auxiliary screen LC and the right auxiliary screen RC shown in FIG. 6, the printed circuit board shown in FIG. 4a or FIG. 3 can be used to drive the corresponding display panel. It can be seen from FIG. 6 that the right auxiliary screen RC is obtained based on the clockwise rotation of the left auxiliary screen LC by a certain angle, that is, the display panels applied to the left auxiliary screen LC and the right auxiliary screen RC may adopt exactly the same design. Therefore, no matter whether the auxiliary screen is disposed on the left side of a vehicle cab, or the auxiliary screen is disposed on the right side of the vehicle cab, or the left and right sides of the vehicle cab are both provided with auxiliary screens, display panels used for the auxiliary screens may be substantially identical, and the printed circuit boards for driving the display panels of the auxiliary screens may also have a same outline, only the positional layout of interfaces of the printed circuit boards used for different auxiliary screens and the layout of signal wirings are designed in a differentiated manner. As a result, the application of the display panel on different models or types of vehicles or at different positions of the same vehicle is realized at a lower cost.

Figure 7:
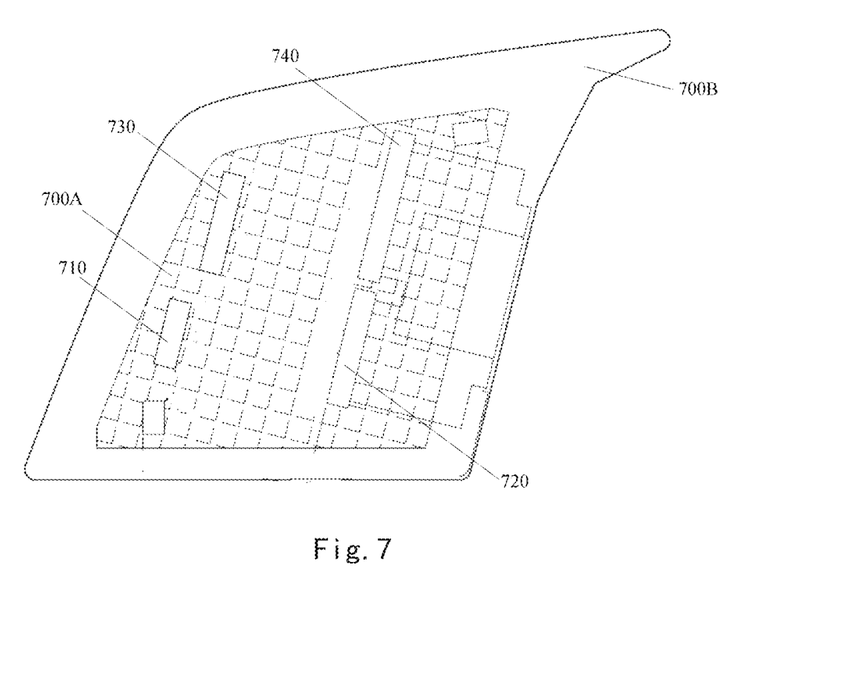
FIG. 7 and FIG. 8 schematically illustrate examples of combining the printed circuit boards provided by different embodiments of the present disclosure with corresponding display panels.

When the printed circuit board provided by the embodiments of the present disclosure is used to drive the display panel, the printed circuit board may be attached to a backside of the display panel opposite to an image display surface thereof. FIG. 7 illustrates a printed circuit board 700A attached to a display panel 700B. In this embodiment, the printed circuit board 700A at least comprises a first interface 710, a second interface 720, a third interface 730 and a fourth interface 740, which may functionally correspond to the first interface 410, the second interface 420, the third interface 430, and the fourth interface 440 shown in FIG. 4a respectively. Moreover, the layout of the first interface 710, the second interface 720, the third interface 730 and the fourth interface 740 on the printed circuit board body is also the same as that of the first interface 410, the second interface 420, the third interface 430 and the fourth interface 440 shown in FIG. 4a. The polygonal outline of the printed circuit board 700A is substantially the same as that of the display panel 700B.

Figure 8:
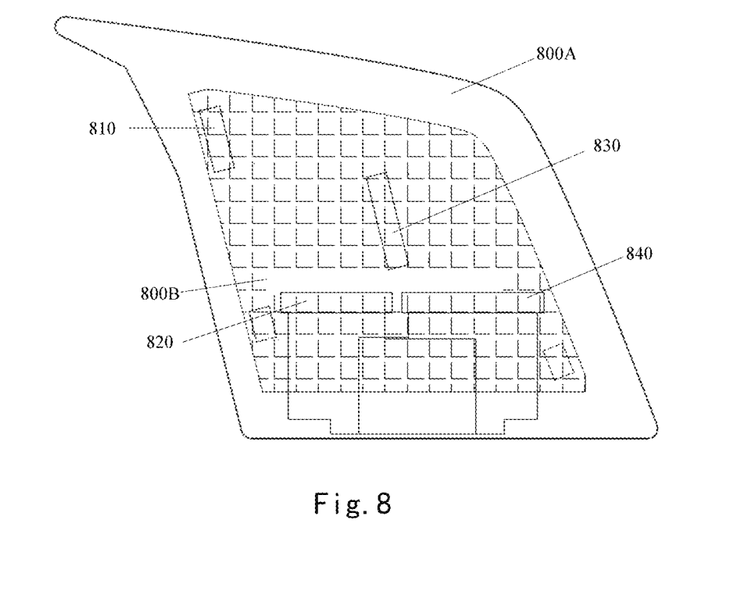

FIG. 8 illustrates a printed circuit board 800A attached to a display panel 800B. In this embodiment, the printed circuit board 800A at least comprises a first interface 810, a second interface 820, a third interface 830 and a fourth interface 840, which may functionally correspond to the first interface 310, the second interface 320, the third interface 330 and the fourth interface 340 shown in FIG. 3 respectively. Moreover, the layout of the first interface 810, the second interface 820, the third interface 830 and the fourth interface 840 on the printed circuit board body is also the same as the layout of the first interface 310, the second interface 320, the third interface 330 and the fourth interface 340 shown in FIG. 3. The polygonal outline of the printed circuit board 800A is substantially the same as that of the display panel 800B.

A further embodiment of the present disclosure provides a display device comprising a display panel and the printed circuit board described in any one of the foregoing embodiments. In some embodiments, there is only a single connection device between the display panel and the printed circuit board. For example, the printed circuit board is connected to the display panel via a first flexible electrical connector. A first end of the first flexible electrical connector is connected to the second interface of the printed circuit board, and a second end of the first flexible electrical connector is connected to the display panel. The first flexible electrical connector may be a flexible printed circuit board (FPC).

Figure 9:
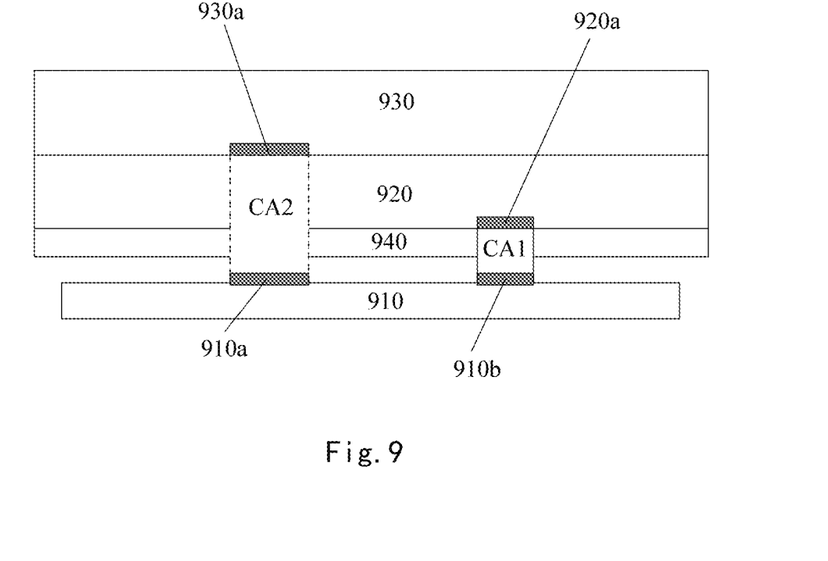
FIG. 9 schematically illustrates a partial sectional view of an image display system according to an embodiment of the present disclosure.

In other embodiments, there may be multiple connection devices between the display panel and the printed circuit board. For example, in the case that the display panel is a BD cell display panel, the display panel comprises a first liquid crystal display panel and a second liquid crystal display panel arranged successively along the light exit direction of the display device. In this case, the display device comprises a first flexible electrical connector and a second flexible electrical connector. The structure of the display device provided by this embodiment can be schematically illustrated with reference to FIG. 9. FIG. 9 schematically illustrates a partial sectional view of a display device according to an embodiment of the present disclosure. In order to clearly illustrate the first flexible electrical connector and the second flexible electrical connector, a printed circuit board 910 is in a state of being separated from the display panel. As shown in FIG. 9, the display device comprises a printed circuit board 910 and a display panel, and the display panel comprises a first liquid crystal display panel 920 and a second liquid crystal display panel 930 arranged successively along the light exit direction of the display device. The display device further comprises a first flexible electrical connector CA1 and a second flexible electrical connector CA2. A first end of the first flexible electrical connector CA1 is connected to a second interface 910b of the printed circuit board 910, and a second end of the first flexible electrical connector CA1 is connected to the first liquid crystal display panel 920. A first end of the second flexible electrical connector CA2 is connected to a fourth interface 910a of the printed circuit board, and a second end of the second flexible electrical connector CA2 is connected to the second liquid crystal display panel 930. The second interface 910b and the fourth interface 910a of the printed circuit board mentioned here may correspond to the second interface 420 and the fourth interface 440 shown in FIG. 4a, the second interface 320 and the fourth interface 340 shown in FIG. 3, or the second interface 220 and the fourth interface 240 shown in FIG. 1 in terms of function and layout. The first flexible electrical connector CA1 and the second flexible electrical connector CA2 may include a flexible printed circuit board (FPC).

Continuing to refer to FIG. 9, in some embodiments, the first liquid crystal display panel in the display panel includes a first source driver 920a, and the second liquid crystal display panel in the display panel includes a second source driver 930a. The second end of the first flexible electrical connector CA1 is connected to the first source driver 920a, and the second end of the second flexible electrical connector CA2 is connected to the second source driver 930a. The length extension direction of the second interface 910b of the printed circuit board 910 is parallel to the length extension direction of the first source driver 920a, and the length extension direction of the fourth interface 910a of the printed circuit board 910 is parallel to the length extension direction of the second source driver 930a. In this way, the probability of distortion or deformation of the first flexible electrical connector CA1 and the second flexible electrical connector CA2 can be further decreased, and the reliability of a signal connection between the display panel and the printed circuit board can be further improved. The first or second source driver mentioned here is usually in the form of an integrated circuit chip, which provides pixel circuits of the display panel with signals for image display including data signals. In some embodiments, the orthographic projections of the first source driver 920a and the second source driver 930a on a light exit surface of the display device may partially or completely overlap each other. In the example of FIG. 1, the first source driver and the second source driver of the display panel are both illustrated as reference number 110.

In the case that the display panel is a liquid crystal display panel, the display device may comprise a backlight module for providing backlight for the display panel. As shown in FIG. 9, the printed circuit board 910 is located on a side of a backlight module 940 facing away from the display panel. Correspondingly, in this embodiment, there may be a signal interaction between the printed circuit board 910 and the backlight module 940 to realize power supply and lighting control for the backlight module. In this case, the printed circuit board 910 may be similar to the printed circuit board shown in FIG. 1, FIG. 3 or FIG. 4a. The printed circuit board comprises a fifth interface and a sixth interface. The fifth interface is electrically connected to the controller to realize a fifth signal interaction between the printed circuit board and the controller, and the sixth interface is electrically connected to the backlight module to realize a sixth signal interaction between the printed circuit board and the backlight module, so that the display panel performs image display under the control of the controller, the printed circuit board, and the backlight module. In some embodiments, the fifth interface and the sixth interface are directly connected via internal wirings of the printed circuit board.

Yet another embodiment of the present disclosure provides an image display system comprising a controller, and the display device according to any one of the foregoing embodiments. The controller is at least electrically connected to the first interface of the printed circuit board, so that the display panel performs image display under the control of the controller and the printed circuit board. Of course, in the case that the printed circuit board comprises a third interface, the controller may be electrically connected to the third interface. The controller may be configured to provide the display panel with a power supply signal and a control signal required for the display panel to display images via the printed circuit board. Main components of the image display system can be schematically illustrated with reference to FIG. 2. The image display system comprises a controller CON, a printed circuit board 200 and a display panel 100. Examples of the display panel 100 include, but are not limited to, a liquid crystal display panel and an organic light emitting diode display panel. In FIG. 2, two connection devices are provided between the display panel 100 and the printed circuit board 200, and between the printed circuit board 200 and the controller CON. However, in other embodiments, a single or more connection devices may be used to achieve a signal transmission between the display panel 100 and the printed circuit board 200, and a signal transmission between the printed circuit board 200 and the controller CON. The specific form of the controller CON may vary with the specific application scenario of the display panel 100. For example, the display panel 100 may be applied in a vehicle cab. In this case, the controller CON may be an electronic control device or an electronic control system of the vehicle, and the image display system is an on-vehicle image display system. The display panel may also be applied to any other indoor or outdoor display platforms.

Some embodiments of the present disclosure have been described above. The terms such as "first", "second" and "third" may be used herein to describe various devices, elements, components or portions, but these devices, elements, components or portions should not be limited by these terms, merely denoting a distinction in terms of designation. In addition, the "electrical connection" mentioned herein includes "direct connection" or "indirect connection". The technical solution of the present disclosure has been described above in conjunction with some embodiments, but the protection scope of the present disclosure is not limited to the specific forms of the embodiments described herein, and the scope of the present disclosure is defined by the appended claims.

The invention claimed is:

1. A printed circuit board for driving a display panel, the printed circuit board comprising a polygonal outline, the polygonal outline comprising a first side and a second side, an extension direction of the first side intersecting and being not perpendicular to an extension direction of the second side, wherein the printed circuit board comprises:
   a first interface configured to be electrically connected to a controller to realize a first signal interaction between the printed circuit board and the controller; and
   a second interface configured to be electrically connected to the display panel to realize a second signal interaction between the printed circuit board and the display panel, so that the display panel performs image display under a control of the controller and the printed circuit board,
   wherein a length extension direction of the first interface forms a first included angle with respect to the extension direction of the first side, a length extension direction of the second interface forms a second included angle with respect to the extension direction of the second side, and the first included angle and the second included angle are each not greater than 20 degrees.

2. The printed circuit board according to claim 1, wherein the printed circuit board further comprises:
   a third interface configured to be electrically connected to the controller to realize a third signal interaction between the printed circuit board and the controller; and
   a fourth interface configured to be electrically connected to the display panel to realize a fourth signal interaction between the printed circuit board and the display panel, so that the display panel performs image display under the control of the controller and the printed circuit board,
   wherein a length extension direction of the third interface is consistent with the length extension direction of the first interface, and a length extension direction of the fourth interface is consistent with the length extension direction of the second interface.

3. The printed circuit board according to claim 2, wherein the first side of the polygonal outline is adjacent to the second side of the polygonal outline.

4. The printed circuit board according to claim 3, wherein the first interface and the second interface are electrically connected to each other, the third interface and the fourth interface are electrically connected to each other, and the polygonal outline comprises a third side opposite to the first side, wherein the first interface and the second interface are closer to the first side than the third interface and the fourth interface, and the third interface and the fourth interface are closer to the third side than the first interface and the second interface.

5. The printed circuit board according to claim 4, wherein an extension direction of the third side intersects the extension direction of the second side to form a fifth included angle, and the fifth included angle is smaller than the third included angle.

6. The printed circuit board according to claim 2, wherein the first side of the polygonal outline and the second side of the polygonal outline are opposite to each other.

7. The printed circuit board according to claim 6, wherein each of the length extension direction of the first interface, the length extension direction of the second interface, the length extension direction of the third interface, and the length extension direction of the fourth interface is parallel to the extension direction of the second side.

8. The printed circuit board according to claim 6, wherein the first interface and the second interface are electrically connected to each other, and the third interface and the fourth interface are electrically connected to each other, wherein the polygonal outline of the printed circuit board further comprises:
   a third side, the extension direction of the first side and the extension direction of the second side each intersecting an extension direction of the third side,
   a fourth side opposite to the third side, the extension direction of the second side and the extension direction of the first side each intersecting an extension direction of the fourth side,
   wherein the first interface and the second interface are closer to the third side than the third interface and the fourth interface, and the third interface and the fourth interface are closer to the fourth side than the first interface and the second interface.

9. The printed circuit board according to claim 2, wherein the printed circuit board further comprises:
   a fifth interface configured to be electrically connected to the controller to realize a fifth signal interaction between the printed circuit board and the controller;
   a sixth interface configured to be electrically connected to a backlight module to realize a sixth signal interaction between the printed circuit board and the backlight module, so that the display panel performs image display under the control of the controller, the printed circuit board and the backlight module,
   wherein the fifth interface is closer to the first side than the sixth interface, and the sixth interface is closer to the second side than the fifth interface.

10. The printed circuit board according to claim 9, wherein a length extension direction of the fifth interface is consistent with the length extension direction of the first interface, the length extension direction of the fifth interface forms an included angle of 70 to 80 degrees with respect to the extension direction of the second side, and a length extension direction of the sixth interface forms an included angle of 60 to 70 degrees with respect to the extension direction of the second side.

11. The printed circuit board according to claim 1, wherein the first included angle and the second included angle are each 0 degree, so that the length extension direction of the first interface is parallel to the extension direction of the first side of the polygonal outline, and the length extension direction of the second interface is parallel to the extension direction of the second side of the polygonal outline.

12. The printed circuit board according to claim 2, wherein the polygonal outline comprises a hexagon, and the first side and the second side are two adjacent sides or two opposite sides of the hexagon.

13. The printed circuit board according to claim 12, wherein the first interface, the second interface, the third interface and the fourth interface are located on a first surface of a printed circuit board body of the printed circuit board, the printed circuit board further comprises an electrical component on the first surface of the printed circuit board body, the electrical component comprises at least one selected from a group consisting of an integrated circuit chip, a resistor and a capacitor, and a height of each of the first interface, the second interface, the third interface and the fourth interface on the first surface of the printed circuit board body is 2 to 15 times a height of the electrical component on the first surface of the printed circuit board body.

14. The printed circuit board according to claim 12, wherein the first surface of the printed circuit board body comprises a component-free region between the electrical component and any one of the first interface, the second interface, the third interface and the fourth interface, wherein the component-free region has a diameter of greater than or equal to 1.5 mm.

15. A display device comprising:
the printed circuit board according to claim 1;
a first flexible electrical connector;
and a display panel,
wherein a first end of the first flexible electrical connector is connected to the second interface of the printed circuit board, and a second end of the first flexible electrical connector is connected to the display panel.

16. A display device comprising:
the printed circuit board according to claim 2;
a first flexible electrical connector;
a second flexible electrical connector,
and a display panel,
wherein the display panel comprises a first liquid crystal display panel and a second liquid crystal display panel arranged successively along a light exit direction of the display device,
wherein a first end of the first flexible electrical connector is connected to the second interface of the printed circuit board, and a second end of the first flexible electrical connector is connected to the first liquid crystal display panel;
a first end of the second flexible electrical connector is connected to the fourth interface of the printed circuit board, and a second end of the second flexible electrical connector is connected to the second liquid crystal display panel.

17. The display device according to claim 16, wherein the first liquid crystal display panel comprises a first source driver, and the second liquid crystal display panel comprises a second source driver, wherein the second end of the first flexible electrical connector is connected to the first source driver, and the second end of the second flexible electrical connector is connected to the second source driver,
wherein the length extension direction of the second interface is parallel to a length extension direction of the first source driver, and the length extension direction of the fourth interface is parallel to a length extension direction of the second source driver.

18. The display device according to claim 15, wherein the display device comprises a backlight module for providing backlight for the display panel, and the printed circuit board is located on a side of the backlight module facing away from the display panel.

19. The display device according to claim 18, wherein the printed circuit board further comprises:
a fifth interface configured to be electrically connected to the controller to realize a fifth signal interaction between the printed circuit board and the controller;
a sixth interface configured to be electrically connected to the backlight module to realize a sixth signal interaction between the printed circuit board and the backlight module, so that the display panel performs image display under the control of the controller, the printed circuit board, and the backlight module.

20. An image display system comprising:
a controller; and
the display device according to any one of claim 15,
wherein the controller is at least electrically connected to the first interface of the printed circuit board, so that the display panel performs image display under the control of the controller and the printed circuit board.

* * * * *